(12) United States Patent
Yoon (10) Patent No.: US 7,566,603 B2
(45) Date of Patent: Jul. 28, 2009

(54) METHOD FOR MANUFACTURING SEMICONDUCTOR DEVICE HAVING METAL SILICIDE LAYER

(75) Inventor: Hyo Geun Yoon, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 399 days.

(21) Appl. No.: 11/486,159

(22) Filed: Jul. 12, 2006

(65) Prior Publication Data

US 2007/0117295 A1 May 24, 2007

(30) Foreign Application Priority Data

Oct. 31, 2005 (KR) .............. 10-2005-0103346

(51) Int. Cl.
| | |
|---|---|
| H01L 21/28 | (2006.01) |
| H01L 21/8232 | (2006.01) |
| H01L 21/336 | (2006.01) |
| H01L 27/088 | (2006.01) |
| H01L 29/417 | (2006.01) |
| H01L 21/8242 | (2006.01) |

(52) U.S. Cl. ............... 438/197; 438/283; 438/299; 257/E27.084; 257/E21.615

(58) Field of Classification Search .......... 438/630, 438/651, 682, 494, 498, 634, 940, 689, 694, 438/696, 698, 706, 738, 740, 744, 743, 745, 438/747, 751, 753, 756, 757, 216, 287, 586, 438/587, 595, 597, 787, 791, 951, 291, 197, 438/283, 299; 257/E27.084, E21.615

See application file for complete search history.

(56) References Cited

U.S. PATENT DOCUMENTS 6,025,255 A * 2/2000 Chen et al. ............... 438/595
6,033,944 A * 3/2000 Shida ....................... 438/199
6,306,707 B1 * 10/2001 Foster et al. .............. 438/264
6,306,713 B1 * 10/2001 Hu et al. ................... 438/299
6,521,955 B1 * 2/2003 Ida et al. ................... 257/382
6,638,843 B1 * 10/2003 Hineman .................. 438/592
6,890,823 B2 * 5/2005 Lee et al. .................. 438/300
2003/0214000 A1 * 11/2003 Jang et al. ................. 257/384
2003/0219944 A1 * 11/2003 Kato et al. ................. 438/257
2004/0029372 A1 * 2/2004 Jang et al. ................. 438/586
2004/0029375 A1 * 2/2004 Lee et al. .................. 438/626
2004/0058522 A1 * 3/2004 Lee et al. .................. 438/618
2004/0084746 A1 * 5/2004 Kim et al. ................. 257/503

(Continued)

FOREIGN PATENT DOCUMENTS

JP     09264697     4/1999

(Continued)

Primary Examiner—Zandra V. Smith
Assistant Examiner—Jeremy J Joy
(74) Attorney, Agent, or Firm—Townsend and Townsend and Crew LLP (57) ABSTRACT

A method for manufacturing a semiconductor device having a metal silicide layer comprises forming a structure including a plurality of gate stacks formed on a semiconductor substrate, forming a gate spacer layer formed on an upper surface of the semiconductor substrate and around a sidewall of each gate stack, and forming an insulation layer between the gate stacks. The method further comprises forming a metal silicide layer on an exposed surface of the semiconductor substrate between the gate stacks.

9 Claims, 5 Drawing Sheets

U.S. PATENT DOCUMENTS

| | | | |
|---|---|---|---|
| 2004/0185671 A1* | 9/2004 | Lee | 438/704 |
| 2005/0136606 A1* | 6/2005 | Rulke et al. | 438/305 |
| 2006/0124986 A1* | 6/2006 | Lee | 257/310 |
| 2007/0117295 A1* | 5/2007 | Yoon | 438/197 |

FOREIGN PATENT DOCUMENTS

| | | | |
|---|---|---|---|
| JP | 11103055 A * | 4/1999 | |
| JP | 2003344056 | 4/2005 | |
| JP | 2005109381 A * | 4/2005 | |
| JP | 2007129189 A * | 5/2007 | |

* cited by examiner

METHOD FOR MANUFACTURING SEMICONDUCTOR DEVICE HAVING METAL SILICIDE LAYER

CROSS-REFERENCE TO RELATED APPLICATION

The present application claims priority from Korean Patent Application No. KR10-2005-0103346 filed on Oct. 31, 2005, the content of which is hereby incorporated by reference into this application.

BACKGROUND OF THE INVENTION

The present invention relates to a method for manufacturing a semiconductor device, and more particularly, to a method for manufacturing a semiconductor device having a metal silicide layer.

Recently, demands for high capacity, high density integration, and high performance of semiconductor devices have been rapidly increasing. However, an increase in the degree of integration of semiconductor devices causes a need for a greater reduction in the line width of a pattern. As a result, source/drain regions and a gate electrode of a n-type MOS transistor or p-type MOS transistor exhibit a gradual decrease in width. For this reason, the surface resistance of the source/drain regions and gate electrode increases, and therefore, becomes the main reason of deterioration in the operational characteristics of devices. Accordingly, in order to restrict such an increase of the surface resistance, metal silicide layers have been placed on a surface of the source/drain regions and gate electrode.

Among a variety of metal silicide layers, in particular, a cobalt silicide ($CoSi_2$) layer has a relatively low specific resistance of approximately 16 to 18 $\mu\Omega\cdot cm$. The cobalt silicide layer is also stable even at a high temperature of more than 800° C., and therefore, can reduce a thermal budget caused by a high-temperature reflow process for a following interlayer dielectric layer, for example, phosphorus silicate glass (PSG) layer or boron phosphorus silicate glass (BPSG) layer. The cobalt silicide layer has a low reactivity with a silicon oxide layer, and therefore, has a low possibility for causing deterioration in the characteristics of a device due to a side reaction. Another advantage of the cobalt silicide layer is in that it can maintain a constant contact resistance regardless of the kind of a device by virtue of a low dopant dependency thereof. Moreover, the cobalt silicide layer, which is composed of cobalt (Co) and a main diffuser, is horizontally formed. This has the effect of restricting the generation of a short between a source and a drain, and eliminating most of the damage with respect to a plasma etching process. Therefore, the cobalt silicide layer ($CoSi_2$) has substantially no risk of damage even if excessive etching is performed to form bit line contact holes.

However, in spite of the above described many advantages, the cobalt silicide layer suffers from the following problems when it is applied to a semiconductor device, more particularly, a semiconductor memory device, such as a dynamic random access memory (DRAM). For example, when a self-align contact (SAC) etching process is performed to expose the surface of a substrate in a peripheral region, a gate spacer layer is previously formed around a sidewall of a gate stack by use of a nitride layer, in order to protect a gate conductive layer. However, when the self-align contact etching process is performed to open the peripheral region for the formation of the cobalt silicide layer ($CoSi_2$), the gate spacer layer may be attacked. In a worse case, the gate spacer layer may be removed, and thus, a self-align contact failure may occur. This causes a problem of device malfunction. Additionally, the etching process may cause a loss of a silicon substrate, and simultaneously, a loss of dopant in source/drain regions, thereby making it impossible to achieve uniform characteristic distribution of transistors throughout a wafer.

SUMMARY OF THE INVENTION

Therefore, the present invention has been made in view of the above problems, and the present invention provides a method for manufacturing a semiconductor device having a metal silicide layer.

In accordance with one embodiment of the present invention, a method for manufacturing a semiconductor device comprises: forming a structure including a plurality of gate stacks formed on a semiconductor substrate, a gate spacer layer formed on an upper surface of the semiconductor substrate and around a sidewall of each gate stack, and an insulation layer between the gate stacks; exposing the gate spacer layer by removing the insulation layer; forming a sacrificial insulation layer on the gate spacer layer; removing a part of the sacrificial insulation layer on the gate spacer layer formed on the upper surface of the semiconductor substrate while maintaining the remaining part of the sacrificial insulation layer on the gate spacer layer formed around the sidewall of each stack; exposing the semiconductor substrate between the gate stacks by removing the gate spacer layer on the semiconductor substrate; and forming a metal silicide layer on an exposed surface of the semiconductor substrate between the gate stacks.

In some embodiments, exposing the gate spacer may be performed by an etching process regulated such that an etching rate ratio of the insulation layer to the gate spacer layer is in a range from about 13:1 to about 30:1.

In some embodiments, the sacrificial insulation layer may have a thickness of about 30 Å to about 150 Å.

In some embodiments, removing the part of the sacrificial layer may be performed via a blanket dry etching process.

In some embodiments, exposing the semiconductor substrate may be performed such that the gate spacer layer formed around the sidewall of each gate stack is protected by the sacrificial insulation layer during the removal of the gate spacer layer on the semiconductor substrate.

In some embodiments, the gate spacer layer may be formed of a nitride layer, and the sacrificial insulation layer may be formed of an oxide layer.

In some embodiments, exposing the semiconductor substrate may be performed by use of a wet etching process.

In some embodiments, the wet etching process may be performed by use of a phosphoric acid solution ($H_3PO_4$).

In some embodiments, the method for manufacturing a semiconductor device may further comprise: performing a second wet etching process for removing an oxide layer prior to and after performing the wet etching process.

In accordance with another embodiment of the present invention, a method for manufacturing a semiconductor device comprises: forming a plurality of gate stacks on a semiconductor substrate having a cell region and a peripheral region; forming a gate spacer layer around a sidewall of each gate stack in the cell region and forming the gate spacer layer on a surface of the semiconductor substrate and around a sidewall of each gate stack in the peripheral region; filling an insulation layer between the gate stacks; removing the insulation layer in the cell region, and forming a plurality of landing plugs between the gate stacks in the cell region; removing the insulation layer in the peripheral region by using a mask layer pattern as an etching mask, the mask layer pattern being configured to expose the peripheral region while covering the cell region; forming a sacrificial insulation layer throughout the cell region having the plurality of landing plugs and the peripheral region having no insulation layer; removing the sacrificial insulation layer formed over the cell region and the sacrificial insulation layer on the substrate in the peripheral region, to expose the gate spacer layer formed on the surface of the semiconductor substrate in the peripheral region; removing the exposed gate spacer layer in the peripheral region, to expose the semiconductor substrate between the gate stacks in the peripheral region; and forming a metal silicide layer on an exposed surface of the semiconductor substrate in the peripheral region.

In some embodiments, the method for manufacturing a semiconductor device may further comprise: forming a buffer insulation layer on the entire surface of the substrate prior to performing the removing the insulation layer in the peripheral region.

In some embodiments, the sacrificial insulation layer may have a thickness of about 30 Å to about 150 Å.

In some embodiments, the gate spacer layer may be formed of a nitride layer, and the sacrificial insulation layer may be formed of a high-temperature oxide layer.

In some embodiments, removing the sacrificial insulating layer may be performed by use of a wet etching process.

In some embodiments, the wet etching process may be performed by use of a phosphoric acid solution ($H_3PO_4$).

In some embodiments, the method for manufacturing a semiconductor device may further comprise: performing a second wet etching process for removing an oxide layer prior to and after performing the wet etching process.

In some embodiments, step removing the exposed gate spacer layer in the peripheral region may be performed such that the gate spacer layer formed around the sidewall of each gate stack is protected by the sacrificial insulation layer during the removal of the gate spacer layer on the semiconductor substrate.

BRIEF DESCRIPTION OF THE DRAWINGS

The above and other features of the present invention will be more clearly understood from the following detailed description taken in conjunction with the accompanying drawings, in which.

DESCRIPTION OF THE EMBODIMENTS

Now, a preferred embodiment of the present invention will be explained with reference to the accompanying drawings.

FIGS. 1 to 10 explain a method for manufacturing a semiconductor device having a metal silicide layer in accordance with an embodiment of the present invention.

Figure 1:
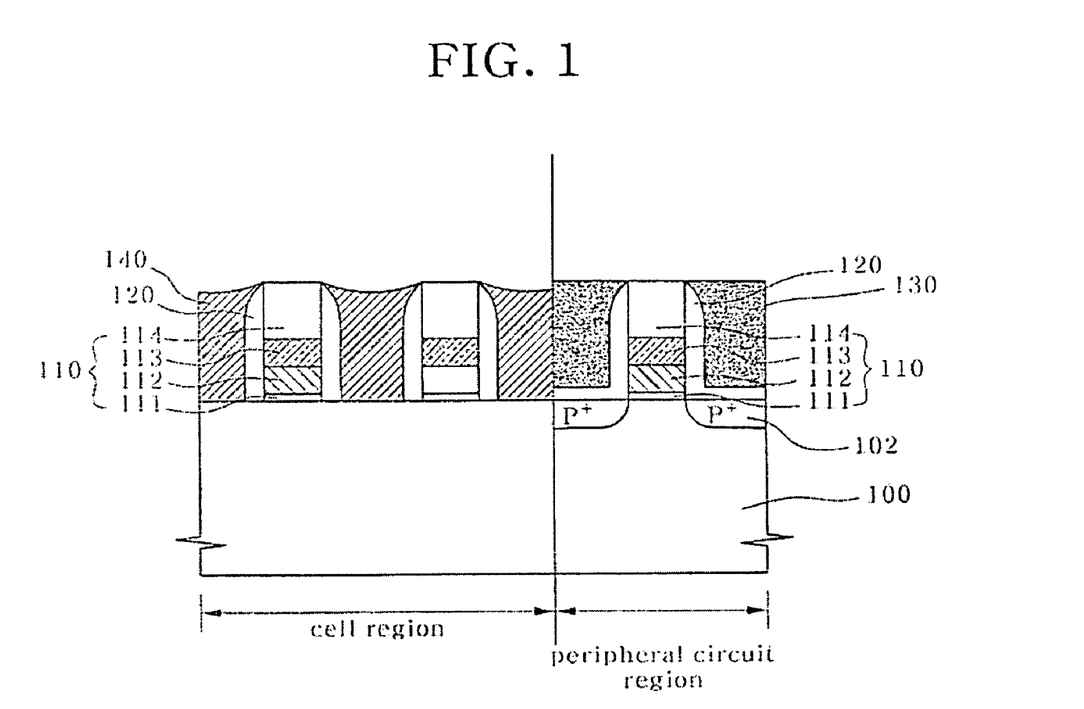
FIGS. 1 to 10 are sectional views illustrating a method for manufacturing a semiconductor device having a metal silicide layer in accordance with an embodiment of the present invention.

Referring first to FIG. 1, a plurality of gate stacks 110 are formed on a semiconductor substrate 100 to be spaced apart from one another. The semiconductor substrate 100 is divided into a cell region and a peripheral region. The semiconductor substrate 100 has a plurality of impurity regions 102 formed in predetermined regions of an upper surface thereof. The impurity regions 102 act as source/drain regions. In particular, the impurity regions 102 in the peripheral region are p+-type impurity regions to form p-channel type transistors. Accordingly, in the case of n-channel type transistors, n+-type impurity regions are arranged in the peripheral region. Although impurity regions in the cell region are not shown in the drawings, it will be appreciated that n+-type impurity regions are arranged in the cell region, in the same manner as the peripheral region.

Each of the gate stacks 110 includes a gate oxide layer pattern 111, a poly-silicon layer pattern 112, a tungsten silicide layer pattern 113, and a hard mask nitride layer pattern 114, which are deposited in this sequence, but is not limited to this sequence, and other layer materials or structures may be adopted in accordance with the kind of a device. After forming the gate stack 110, a gate spacer layer 120 is formed around a sidewall of the gate stack 110. In this case, the gate spacer layer 120 is also formed on a surface of the respective impurity regions 102 in the peripheral region, in addition to the sidewall of the gate stack 110. Hereinafter, the gate spacer layer 120, which exists in the remaining region except for the sidewall of the gate stack 110, is called "a bottom gate spacer layer 120".

Next, an insulation layer 130 is deposited on the entire surface of the resultant, to fill up an empty space between the gate stacks 110. Then, a mask layer pattern (not shown) for exposing only the cell region is used to remove the exposed part of the insulation layer 130 in the cell region. The removal of the insulation layer 130 may be performed via a self align contact (SAC) process, and consequently, self-aligned contact holes are formed between the gate stacks 110 in the cell region. Successively, a landing plug conductive layer, such as a poly-silicon layer, fills up the self-aligned contact holes, and an etchback or planarizing process is performed, to form a plurality of landing plugs 140 that are separated from one another. During the formation of the landing plugs 140 in the cell region, the peripheral region is covered by the mask layer pattern (not shown), and therefore, the insulation layer 130 remains between the gate stacks 110 in the peripheral region. The mask layer pattern in the peripheral region is removed after forming the landing plugs 140.

Figure 2:
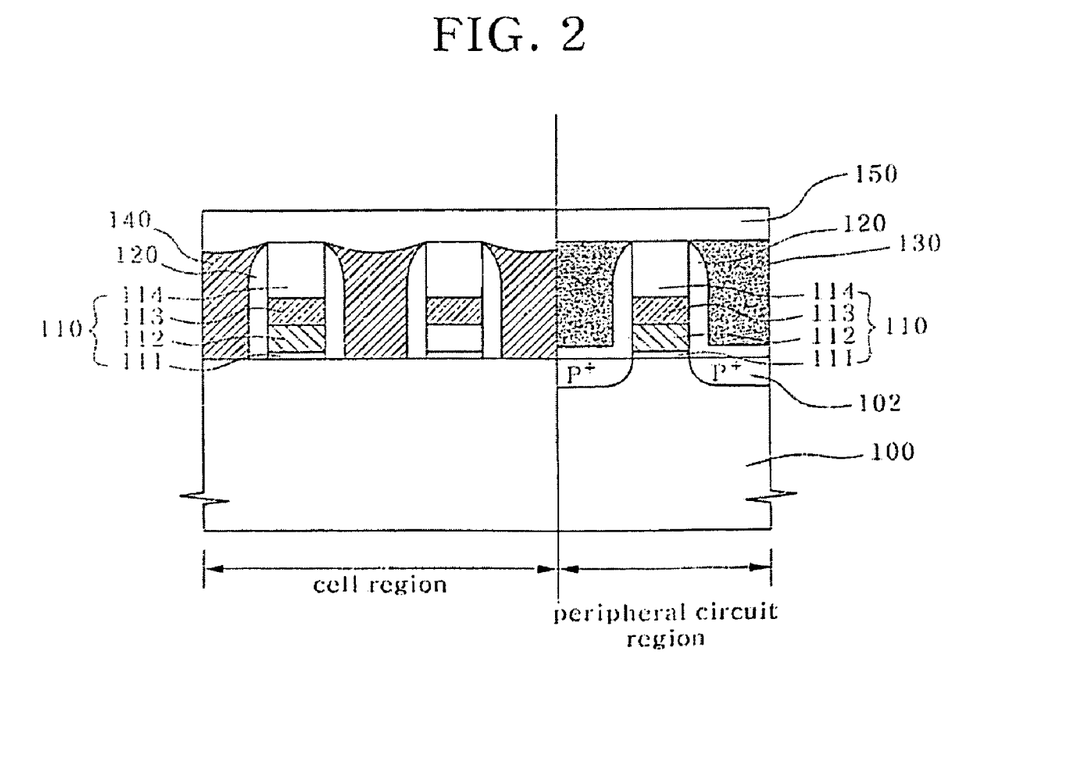

Next, referring to FIG. 2, a buffer insulation layer 150 is formed throughout the cell region and the peripheral region. The buffer insulation layer 150 is formed of a low-pressure tetra ethyl ortho silicate (LP-TEOS) oxide layer having a thickness of about 100 Å to about 1000 Å. In some embodiments, other insulation layers may be used as a buffer, or no insulation layer may be used.

Figure 3:
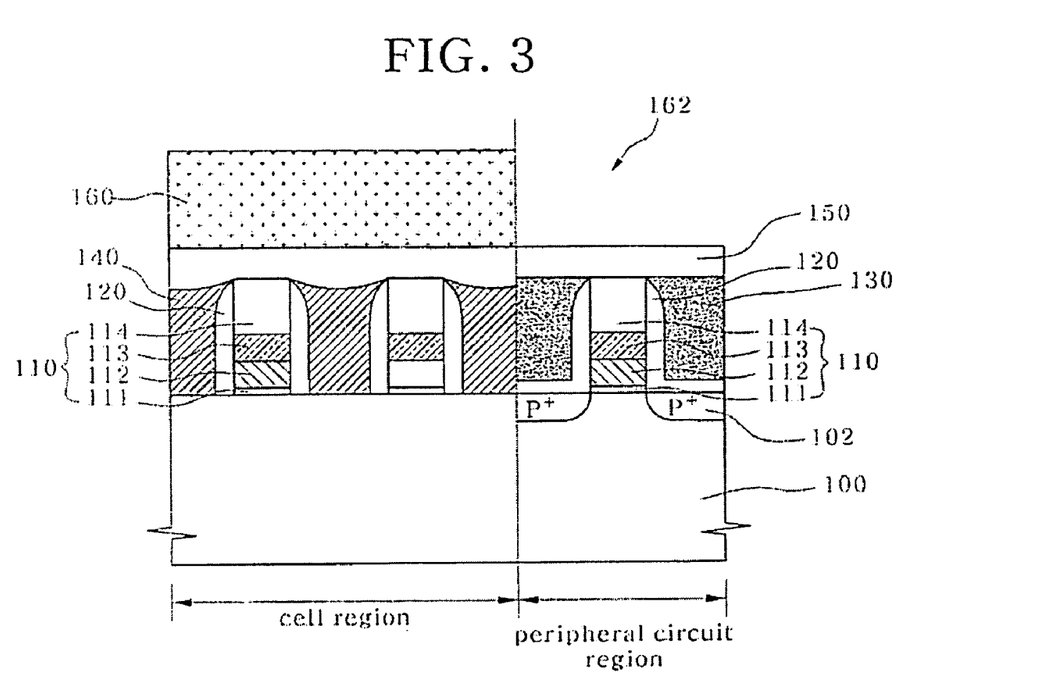

Then, referring to FIG. 3, a photoresist layer pattern 160 is formed on the buffer insulation layer 150. The photoresist layer pattern 160 has an opening 162 for exposing the peripheral region to the outside. That is, the cell region is covered by the photoresist layer pattern 160, whereas the peripheral region is exposed to the outside by the opening 162 of the photoresist layer pattern 160. In some embodiments, a hard mask layer pattern may be used instead of the photoresist layer pattern 160.

Figure 4:
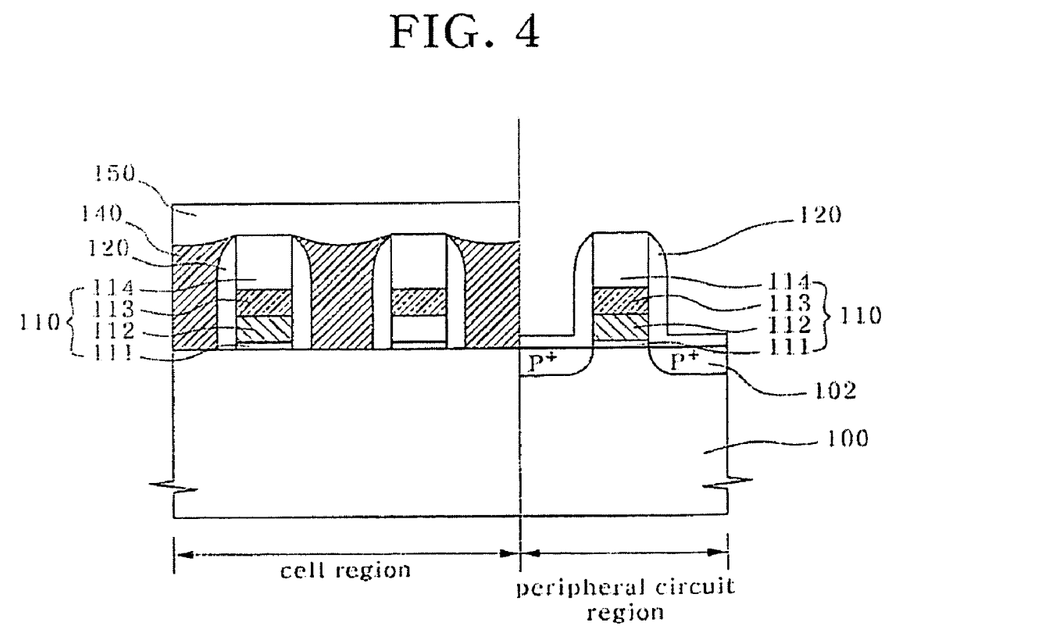

Referring to FIG. 4, the buffer insulation layer 150, which is exposed to the outside in the peripheral region, and the insulation layer 130 between the gate stacks 110 are removed in sequence by using the photoresist layer pattern 160 as an etching mask. For the sequential removal of both the layers 150 and 130, the etching process is regulated such that an etching rate ratio of the insulation layer 130 to the gate spacer layer 120 is in a range from 13:1 to 30:1, and an upper surface of the bottom gate spacer layer 120 in the peripheral region serves as an etching stop layer. In some embodiments, the insulation layer 130 may be partially left on the bottom gate spacer layer 120 by a predetermined thickness. In this case, the thickness of the remaining insulation layer 130 may be less than approximately 30 Å. The etching process is not performed with respect to the bottom gate spacer layer 120, and therefore, there is no risk of damage to the gate spacer layer 120 formed around the sidewall of the gate stack 110 due to the etching process. After completing the etching process, the photoresist layer pattern 160 is removed via a stripping method. Meanwhile, the etching process is performed by use of a dry etching method, in order to prevent unintentional lifting of the photoresist layer pattern 160. In some embodiments, each gate stack in the peripheral region has a width of about 350 nm to about 650 nm and a height of about 350 nm to about 600 nm, respectively. Therefore, if a wet etching method is used at the critical dimensions, a lateral attack may be caused, resulting in lifting of the photoresist layer pattern 160.

Figure 5:
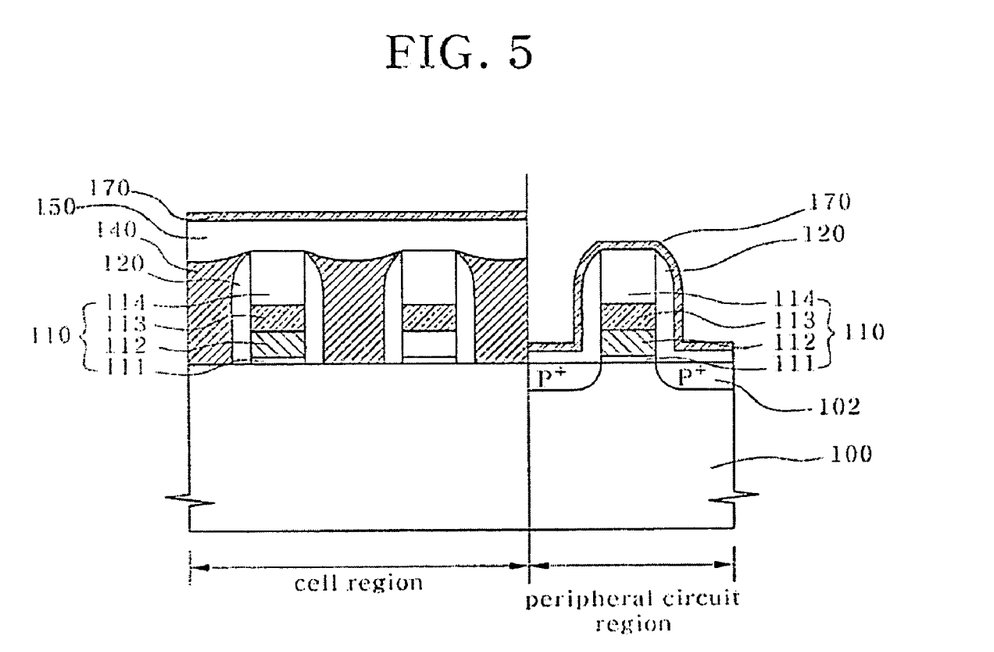

Referring to FIG. 5, a sacrificial insulation layer 170 is formed on the entire surface of the resultant. The sacrificial insulation layer 170 is formed on the buffer insulation layer 150 in the cell region and on the gate stack 110 and the gate spacer layer 120 in the peripheral region. In a following process for removing the bottom gate spacer layer 120, the sacrificial insulation layer 170 is used to protect the gate spacer layer 120 formed around the sidewall of the gate stack 110. Accordingly, the sacrificial insulation layer 170 is made of a material having a sufficient etching rate ratio with respect to a constituent material of the gate spacer layer 120. For example, when the gate spacer layer 120 is formed of a nitride layer, the sacrificial insulation layer 170 may be formed of an oxide layer, more particularly, a high-temperature oxide (HTO) layer. In some embodiments, a thickness of the sacrificial insulation layer 170 is in a range from about 30 Å to about 150 Å.

Figure 6:
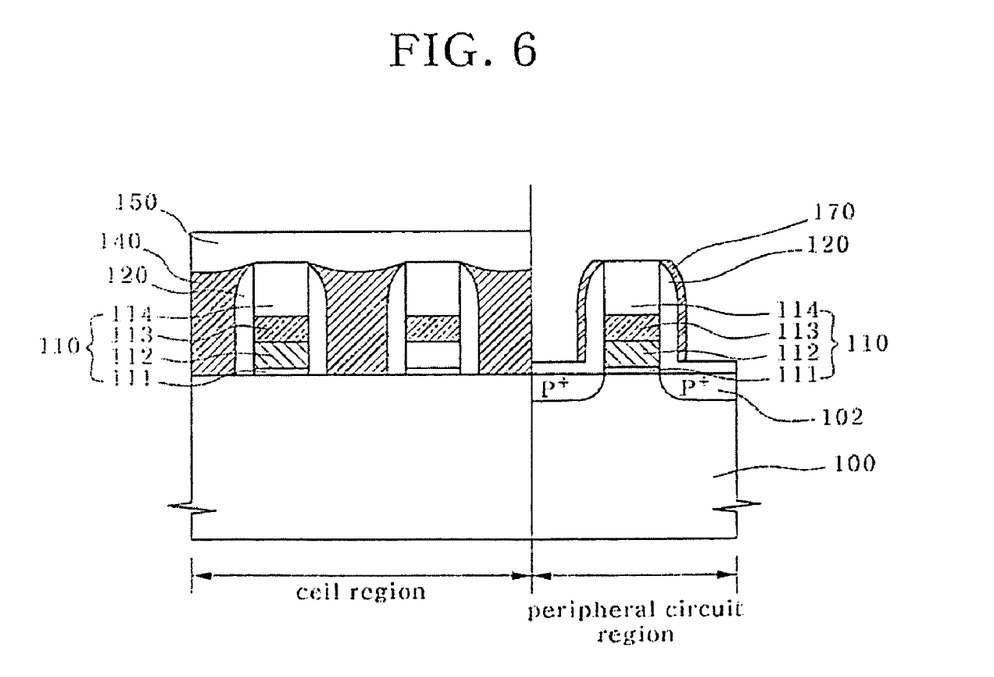

Referring to FIG. 6, a blanket dry etching method is performed to remove the sacrificial insulation layer 170 formed on the buffer insulation layer 150 in the cell region, and to remove the bottom gate spacer layer 120 and the sacrificial insulation layer 170 on the upper surface of the gate stack 110 in the peripheral region. When using the dry etching method, the bottom gate spacer layer 120 is exposed to the outside, but the sacrificial insulation layer 170 formed on the gate spacer layer 120 around the sidewall of the gate stack 110 remains by a predetermined thickness.

Figure 7:
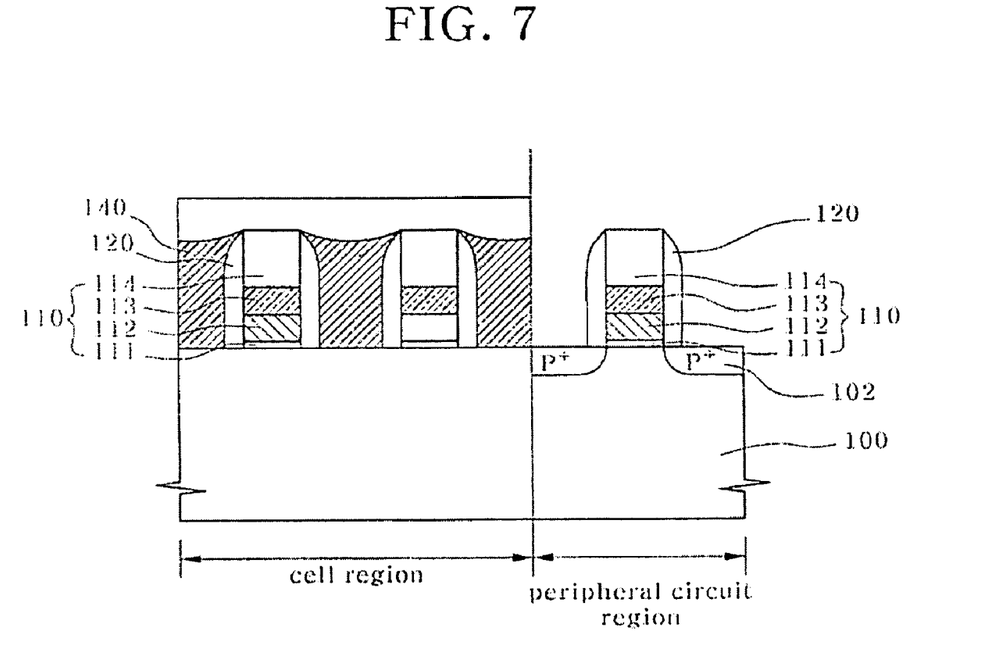

Referring to FIG. 7, in order to remove the remaining sacrificial insulation layer that is formed of a native oxide layer, the resultant of FIG. 6 is dipped into a buffer oxide etchant (BOE), which is diluted by a ratio of about 300:1, for about 2 seconds to about 10 seconds. Then, the resultant is again dipped into a phosphoric acid solution ($H_3PO_4$) having a temperature of approximately 160° C. for about 2 minutes to about 10 minutes, to remove the exposed bottom gate spacer layer 120. If the gate spacer layer 120 is not formed of the nitride layer, other solutions may be used instead of the phosphoric acid solution ($H_3PO_4$). During the removal of the bottom gate spacer layer 120, the gate spacer layer 120 formed around the sidewall of the gate stack 110 is protected by the sacrificial insulation layer 170. Although FIG. 7 illustrates no sacrificial insulation layer 170 formed on the gate spacer layer 120 around the sidewall of the gate stack 110, the sacrificial insulation layer 170 may remain by a predetermined thickness in accordance with some embodiments. The resultant is dipped into the buffer oxide etchant (BOE) for about 2 seconds to about 20 seconds, in order to completely expose the impurity regions 102 of the semiconductor substrate 100.

Figure 8:
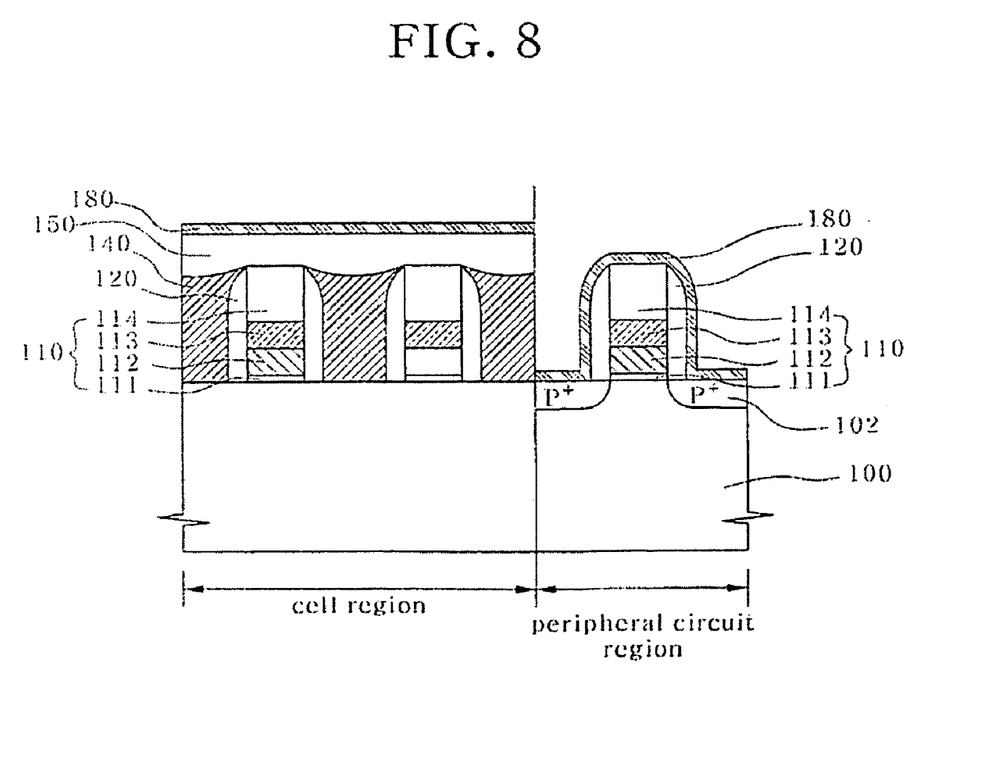

Referring to FIG. 8, a metal layer 180 is formed on the entire surface of the resultant, so that a metal silicide layer is formed on the impurity regions 102 in the peripheral region. The metal silicide layer may be made up of: a cobalt silicide layer ($CoSi_2$), a titanium silicide layer ($TiSi_2$), a nickel silicide layer ($NiSi_2$), a platinum silicide layer ($PtSi_2$), a palladium silicide layer ($PdSi_2$), and/or combinations thereof. In some embodiments, when a cobalt silicide layer ($CoSi_2$) is used, the metal layer 180 is formed of a cobalt (Co) layer having a thickness of about 80 Å to about 250 Å by use of a physical vapor deposition (PVD) method.

Figure 9:
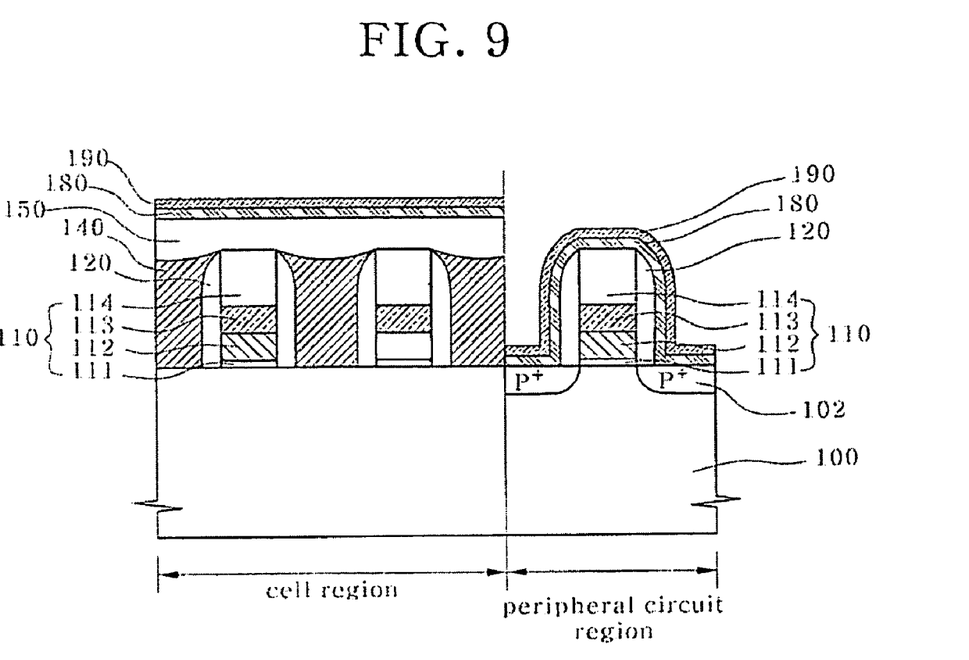

Referring to FIG. 9, an oxidation restrictive layer 190 is formed on the metal layer 180 to restrict a surface oxidation. In some embodiments, the oxidation restrictive layer 190 is formed of a titanium/titanium nitride (Ti/TiN) layer having a thickness of about 50 Å to about 100 Å. In other embodiments, the oxidation restrictive layer 190 has a thickness of about 100 Å to about 200 Å. However, in still other embodiments, other material layers may be used or no oxidation restrictive layer may be used.

Figure 10:
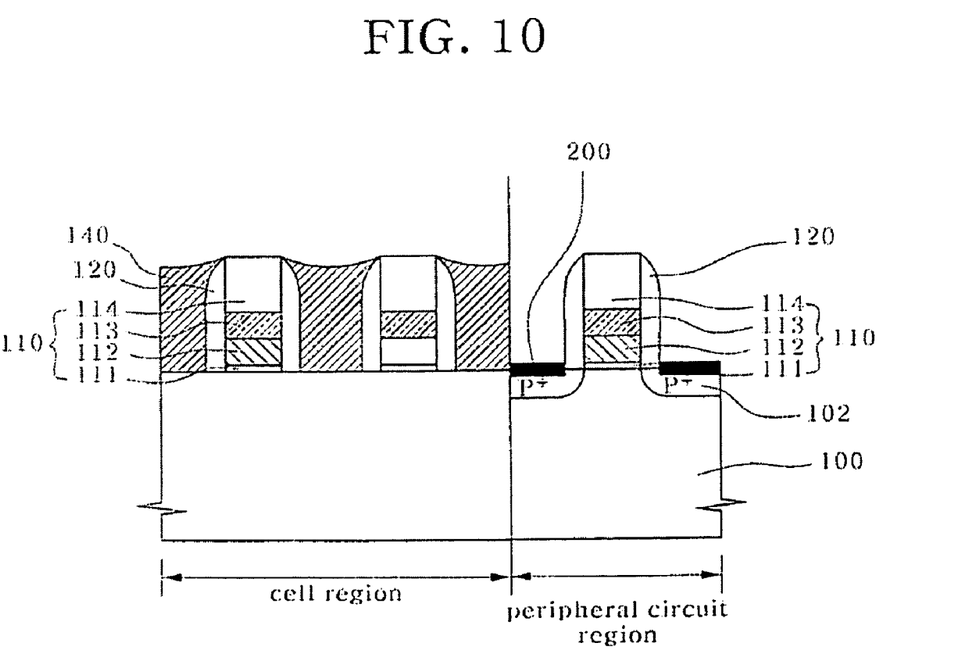

Referring to FIG. 10, a silicide process, more particularly, a rapid thermal annealing (RTA) process is performed within a temperature range from about 600° C. to about 1000° C. for about 5 seconds to about 20 seconds, to form a metal silicide layer 200. Then, the oxidation restrictive layer 190 and the remaining non-reactive metal layer 180 are removed by use of a standard cleaning-1 (SC-1) or sulfuric acid peroxide mixture (SPM) solution.

As apparent from the above description, the present invention provides a method for manufacturing a semiconductor device having a metal silicide layer wherein a sacrificial insulation layer is deposited on a gate space layer formed around a sidewall of each gate stack and an upper surface of a semiconductor substrate after removing an insulation layer between adjacent gate stacks in a peripheral region, whereby the gate spacer layer formed around the sidewall of the gate stack can be protected by the sacrificial insulation layer when the remaining gate spacer on the upper surface of the substrate is removed. As a result, the present invention can prevent damage to the gate spacer layer formed around the sidewall of the gate stack, and can reduce a loss of the semiconductor substrate due to an etching process.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductor device comprising:
   forming a plurality of gate stacks over a semiconductor substrate having a cell region and a peripheral region;
   forming a gate spacer layer around a sidewall of each gate stack in the cell region and forming the gate spacer layer over a surface of the semiconductor substrate and around a sidewall of each gate stack in the peripheral region;
   filling an insulation layer between the gate stacks;
   removing the insulation layer in the cell region, and forming a plurality of landing plugs between the gate stacks in the cell region;
   removing the insulation layer in the peripheral region by using a mask layer pattern as an etching mask, the mask layer pattern being configured to expose the peripheral region while covering the cell region;
   forming a sacrificial insulation layer throughout the cell region having the plurality of landing plugs and the peripheral region having no insulation layer;
   removing the sacrificial insulation layer formed over the cell region and the sacrificial insulation layer over the substrate in the peripheral region, to expose the gate spacer layer formed over the surface of the semiconductor substrate in the peripheral region;

removing the exposed gate spacer layer in the peripheral region, to expose the semiconductor substrate between the gate stacks in the peripheral region; and forming a metal silicide layer over an exposed surface of the semiconductor substrate in the peripheral region.

2. The method as set forth in claim 1, wherein each gate stack has a width of about 350 nm to about 650 nm and a height of about 350 nm to about 600 nm.

3. The method as set forth in claim 1, further comprising:

forming a buffer insulation layer over the entire surface of the substrate prior to removing the insulation layer in the peripheral region.

4. The method as set forth in claim 1, wherein the sacrificial insulation layer is formed to a thickness of about 30 Å to about 150 Å.

5. The method as set forth in claim 1, wherein the gate spacer layer comprises a nitride layer, and the sacrificial insulation layer comprises a high-temperature oxide layer.

6. The method as set forth in claim 1, further comprising:

removing the sacrificial insulation layer over the gate spacer layer in the peripheral region by use of a wet etching process.

7. The method as set forth in claim 6, wherein the wet etching process is performed by use of a phosphoric acid solution ($H_3PO_4$).

8. The method as set forth in claim 6, further comprising:

performing a second wet etching process for removing an oxide layer prior to and after performing the wet etching process.

9. The method as set forth in claim 1, wherein removing the exposed gate spacer layer in the peripheral region is performed such that the gate spacer layer formed around the sidewall of each gate stack is protected by the sacrificial insulation layer during the removal of the gate spacer layer over the semiconductor substrate.

* * * * *